(12) United States Patent
Johnson (10) Patent No.: US 6,385,977 B1
(45) Date of Patent: May 14, 2002

(54) ESRF CHAMBER COOLING SYSTEM AND PROCESS

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/774,183

(22) PCT Filed: Aug. 3, 1999

(86) PCT No.: PCT/US99/17516

§ 371 Date: Feb. 5, 2001

§ 102(e) Date: Feb. 5, 2001

(87) PCT Pub. No.: WO00/08229

PCT Pub. Date: Feb. 17, 2000

Related U.S. Application Data (60) Provisional application No. 60/095,036, filed on Aug. 3, 1998.

(51) Int. Cl.[7] ............................................... F25D 17/02
(52) U.S. Cl. .......................................................... 62/64
(58) Field of Search ............................... 62/64, 62, 373

(56) References Cited

U.S. PATENT DOCUMENTS

| 3,686,528 | A | * | 8/1972 | Sheets ......................... 315/111 |
| 5,234,529 | A | * | 8/1993 | Johnson ................. 219/121.49 |
| 5,247,152 | A | | 9/1993 | Blankenship |

FOREIGN PATENT DOCUMENTS

JP 59-170273 9/1984

* cited by examiner

*Primary Examiner*—William C. Doerrler
(74) *Attorney, Agent, or Firm*—Oblon, Spivak, McClelland, Maier & Neustadt, P.C.

(57) ABSTRACT

A method and system for cooling an electrostatically shielded radio frequency (ESRF) plasma source. The method and system utilize an electrostatic shield, having plural ribs, which vaporizes a coolant and sprays the vapor against a process tube or a bias shield. The vapor is either sprayed underneath the ribs or between adjacent ribs. This design avoids using baths of liquid coolants that can absorb gases which lead to arcing between induction coils.

19 Claims, 9 Drawing Sheets

| | | |
|---|---|---|
| CHAMBER HEIGHT | 12 INCHES | 30.48 CM |
| CHAMBER DIAMETER | 30 INCHES | 76.2 CM |
| CHAMBER AREA | 1837.832 INCH ** 2 | 11856.96 CM ** 2 |
| CHAMBER THICKNESS | 0.375 INCHES | 0.9525 CM |
| CHAMBER VOLUME | 689.1869 INCH ** 3 | 11293.75 CM ** 3 |
| CHAMBER MATERIAL | Al2O3 | |
| CHAMBER MATERIAL DENSITY | 3.85 GM/CM ** 3 | |
| CHAMBER HEATED MASS | 43480.94 GMS | |
| CHAMBER MATERIAL HEAT CAPACITY | 1.025 JOULES/GM * DEG C | |
| CHAMBER HEAT CAPACITY | 44567.96 JOULES/DEG C | |
| HEAT UP TIME FOR CHAMBER | 5 MINUTES | 300 SEC |
| AMBIENT TEMPERATURE TO BEGIN HEAT UP | 15 DEG C | |
| MAXIMUM OPERATING TEMPERATURE | 175 DEG C | 448 DEG K |
| EMISSIVITY | 0.9 | |
| PLANK'S CONSTANT | 5.67E-12 WATTS/k ** 4 | |
| RADIATION LOSS | 2.06E-01 WATTS/CM ** 2 | |
| RADIATION LOSS (MAXIMUM TOTAL) | 2.44E+03 WATTS | |
| HEAT REQUIRED TO GET HOT | 7130874 JOULES | |
| HEATER POWER TO ATTAIN HEAT UP WITHOUT LOSS | 23770 WATTS | |
| POWER RATE AT MAX TEMPERATURE | 33% | |
| POWER AT MAXIMUM TEMPERATURE | 7844 WATTS | |
| COOLING FLUID TEMPERATURE | 30 DEG C | |
| HEAT CONDUCTIVITY OF THERMAL INSULATION | 0.0046 WATTS/CM * DEG C | |
| MAXIMUM HEATER TURN DOWN WITH CONTROL | 0.05 | |
| MINIMUM HEATER POWER FOR CONTROL | 1188.5 | |
| MINIMUM OPERATING TEMPERATURE | 50 DEG C | |
| HEAT LOSS AT MINIMUM TEMPERATURE | 1082 WATTS | |

| FLUID DELIVERY TEMPERATURE | 30 DEG C | | | | | | | |
|---|---|---|---|---|---|---|---|---|
| FLUID TYPE (3M DESIGNATION) | 87 | 72 | 84 | 77 | 104 | 75 | 40 | 43 | 70 |
| HEAT CAPACITY GM* CAL/GM* DEG C | 0.25 | 0.25 | 0.25 | 0.25 | 0.25 | 0.25 | 0.25 | 0.25 | 0.25 |
| HEAT CAPACITY JOULES/GM* DEG C | 1.045 | 1.045 | 1.045 | 1.045 | 1.045 | 1.045 | 1.045 | 1.045 | 1.045 |
| DENSITY | 1.63 | 1.68 | 1.73 | 1.78 | 1.77 | 1.77 | 1.87 | 1.88 | 1.94 |
| HEAT OF VAPORIZATION GM * DEG C | 24 | 22 | 19 | 20 | 22 | 21 | 17 | 17 | 16 |
| HEAT OF VAPORTIZATION JOULES/GM | 100.32 | 91.96 | 79.42 | 83.6 | 91.96 | 87.78 | 71.06 | 71.06 | 66.88 |
| BOILING POINT | 30 | 56 | 80 | 97 | 101 | 102 | 155 | 174 | 215 |
| TOTAL HEAT GAIN JOULES/GM — 30 TO MAX | 251.845 | 243.485 | 230.945 | 235.125 | 243.485 | 239.305 | 222.585 | 222.585 | 218.405 |
| FLOW RATE TO REMOVE MAX HEAT (GMS/SEC) | 31.15 | 32.22 | 33.96 | 33.36 | 32.22 | 32.78 | 35.24 | 35.24 | 35.91 |
| FLOW RATE TO REMOVE MAX HEAT (GMS/MIN) | 1868.8 | 1932.9 | 2037.9 | 2001.6 | 1932.9 | 1966.7 | 2114.4 | 2114.4 | 2154.9 |
| FLOW RATE TO REMOVE MAX HEAT (LITERS/MIN) | 1.15 | 1.15 | 1.18 | 1.12 | 1.09 | 1.11 | 1.13 | 1.12 | 1.11 |

*FIG. 7B*

ESRF CHAMBER COOLING SYSTEM AND PROCESS

CROSS-REFERENCE TO CO-PENDING APPLICATIONS

The present application is related to and claims priority to U.S. provisional application Ser. No. 60/095,036, filed Aug. 3, 1998, and entitled "ESRF CHAMBER COOLING SYSTEM AND PROCESS." The contents of that application are incorporated herein by reference.

The present application is related to the following co-pending applications: Ser. No. 60/059,173, entitled "Device and Method for Detecting and Preventing Arcing in RF Plasma Systems," Ser. No. 60/059,151, entitled "System and Method for Monitoring and Controlling Gas Plasma Processes," and Ser. No. 60/065,794, entitled "All-Surface Biasable and/or Temperature-Controlled Electrostatically-Shielded RF Plasma Source." The present application is also related to co-pending application Ser. No. 60/095,035, entitled "ESRF COOLANT DEGASSING PROCESS," filed Aug. 3, 1998, and application Ser. No. PCT/US99/17520 filed Aug. 3, 1999 entitled "ESRF COOLANT DEGASSING PROCESS," filed concurrently with the present application, also naming Wayne L. Johnson as an inventor. Each of those co-pending applications is incorporated herein in its entirety by reference.

BACKGROUND OF THE INVENTION

1. Field of the Invention

The present invention is directed to a method and system for cooling a plasma processing system, and in particular to a method and system for utilizing: (1) coolants that are expanded through an orifice and converted to gas that is applied to an exterior of a process tube and (2) an electrostatic shield that cools the processing tube by evaporating coolant using evaporation orifices in the electrostatic shield and directing the cooled vapor onto the process tube.

2. Description of the Background

In order to fabricate semiconductor wafers with submicron features using etch and deposition processes, modern semiconductor processing systems utilize plasma assisted techniques such as reactive ion etching (RIE), plasma enhanced chemical vapor deposition (PECVD), sputtering, reactive sputtering, and ion assisted vapor deposition (PVD). In addition to the above-referenced co-pending applications, another example of a gas plasma processing system is described in U.S. Pat. No. 5,156,345, to Wayne L. Johnson, the inventor of the present application. In such known systems, a gas is introduced to a processing environment wherein a gas plasma is formed and maintained through the application of radio frequency (RF) power. Typically, RF power is inductively coupled to the plasma using a helical coil.

Normally, the generation of a gas plasma also produces a substantial amount of heat that must be removed in order to maintain the processing system at a process-specific temperature. The removal of this heat has heretofore been inefficient and based on a cumbersome design. Known ESRF plasma sources have been cooled using baths of liquid coolants, such as FLUORINERT, which also act as dielectrics. The definition of a good dielectric at radio frequencies is that the fluid must have a low power loss per unit volume when exposed to an intense electric field. However, these particular fluids disadvantageously adsorb large quantities of gas, such as air. The four main sources of adsorbed gas are: (1) gas already trapped in the liquid prior to shipment (i.e., gas that was adsorbed prior to receipt by the plasma processing system user), (2) gas adsorbed into the liquid when the liquid is exposed to air, e.g., during pouring between containers before using the liquid, (3) gas adsorbed when air in the chamber is replaced by fluid during an initial filling cycle, and (4) the presence of air in any part of the system when fluid is being pumped. Furthermore, gas may be adsorbed into the coolant after the coolant pumps are stopped. When the pumps stop, if coolant in the high parts of the system drains to lower parts, then air replaces the drained coolant. When the pumps are restarted, the air may be broken down into bubbles which become another source of adsorbable gas.

In the high field regions, strong dissipation can occur leading to high local heating, hence, raising the local temperature of the coolant fluid. In so doing, the rate of gas evolution is increased permitting more gas to come out of solution, and generate bubbles that coalesce on the coil surface by dielectro-fluoretic attraction. The attached bubbles generate a dielectric difference at the coil surface which leads to non-uniform electric fields, localized heating, and arcing. This arcing can occur at voltages well below the measured dielectric strength of the fluid if the gas is not evolved from the liquid coolant before use in the resonator cavity. For example, FLUORINERT adsorbs a volume of gas equivalent to its own liquid volume and must be treated to remove the trapped gas.

In order to avoid arcing due to the rapid evolution of adsorbed gas, known systems gradually increase power to the plasma source while continuously pumping coolant through the ESRF plasma chamber. The gradual increase in RF power takes place over a period of time sufficient to slowly evolve adsorbed gas from the coolant. Although running the coolant in this way evolves trapped gases, a considerable amount of time is required. Often this process will take hours, thereby delaying the use of the plasma system in processing wafers.

In addition to the lengthy time period required by known systems to evolve adsorbed gas, the cooling systems coupled to a plasma source may be very cumbersome due to the large cooling lines used in large wafer (i.e., 300 mm) processing systems. Consequently, significant amounts of air are generally adsorbed when the processing chamber has been opened with the coolant lines remaining attached. The lines have typically remained attached since the coolant lines may contain hundreds of pounds of coolant. As a result, lifting the attached lines to open the chamber has been difficult, but not impossible.

Previously, it was not known how to replace the large lines with an alternate cooling mechanism. The large lines were required in order to provide the large coolant exchange (e.g., approximately 50–75 gallons/minute) needed to remove the heat from the process tube. Also, flexible lines were difficult to use because of the weight and pressure of the coolant required.

SUMMARY OF THE INVENTION

It is an object of the present invention to provide an improved method and system for cooling an ESRF source.

It is another object of the present invention to provide an improved method and system for cooling an ESRF source using a vapor coolant instead of a bath of liquid coolant.

It is a further object of the present invention to provide an ESRF cavity that can be tuned in atmospheric conditions instead of tuning using elements submerged in a temperature controlled fluid.

These and other objects of the present invention are achieved by a method and system utilizing coolant that is evaporated as it passes through a shield (prior to being applied to the exterior of a process tube) to remove the heat generated in an RF powered plasma source. Using a series of nozzles to apply low pressure coolant to the process tube, the present invention removes heat by vaporizing the liquid coolant and then pumping away the vapor. This method avoids the arcing that occurs in systems using baths of liquid coolant. Further, since the dielectric constant of the material around the coil remains close to the same between air and the dielectric fluid, the ESRF cavity can be tuned in air and will remain tuned over a wide range of temperatures. (That is, it is possible to reduce the shift in tuning that would otherwise result from a temperature-based change in the dielectric constant.)

More specifically, these and other objects of the present invention are achieved by a method and system utilizing a process tube that is cooled using a shield which surrounds the process tube. By expanding the coolant through a series of expansion orifices (e.g., disposed along the ribs of the shield) to a pressure lower than the coolant's vapor pressure, the coolant is vaporized as it exits the orifices. That vapor is then impinged upon the process tube to remove heat from the shield and the process tube. Heat is removed through one or more of (1) forced convection of cool vapor over the surface of the process tube and (2) conduction.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

In the present invention, ESRF systems are cooled without encountering problems previously associated with the use of untreated liquid coolants, namely arcing around helical coils. One embodiment of the invention uses a liquid dielectric that is evaporated and applied to hot surfaces, rather than submerging the hot surfaces in a liquid coolant.

Figure 1:
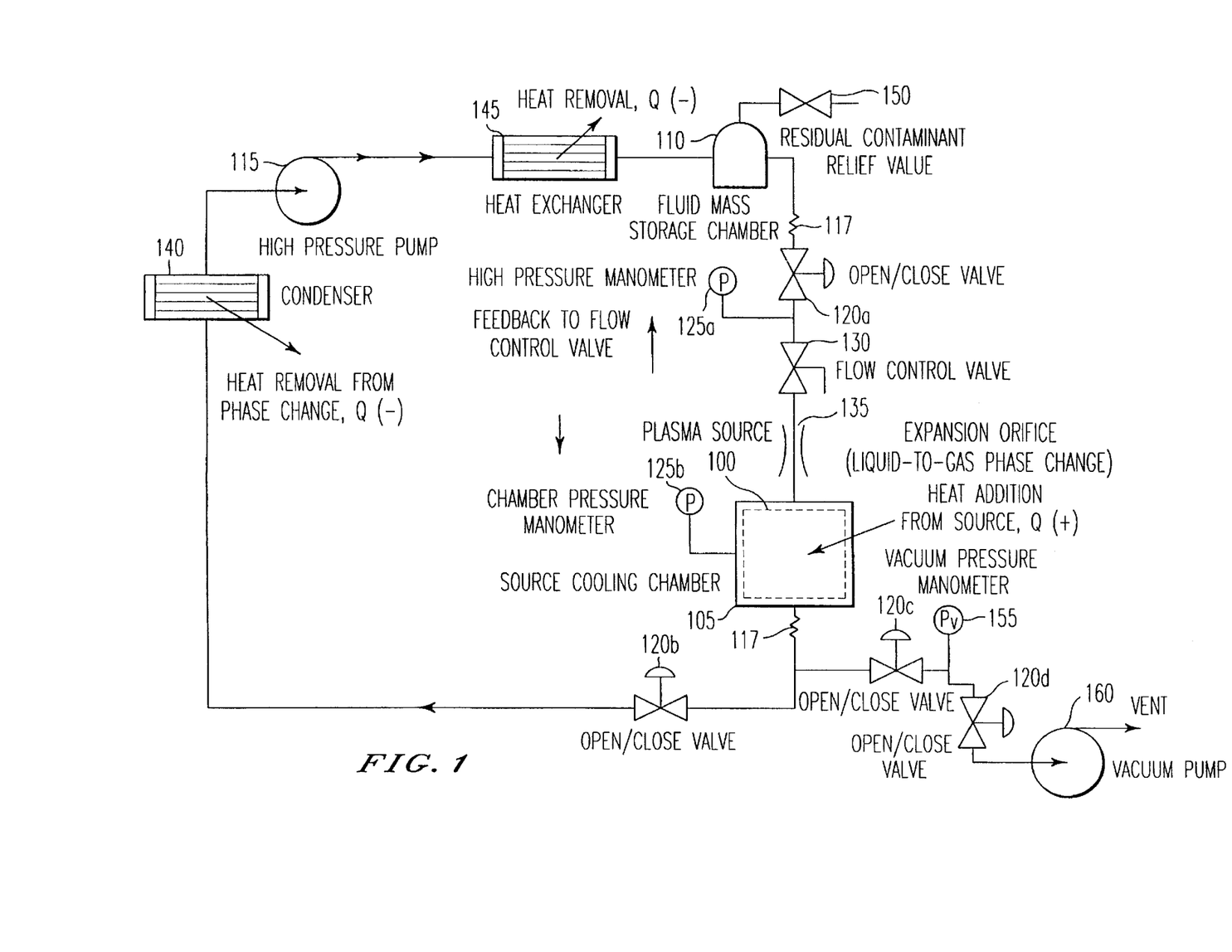
FIG. 1 is a schematic illustration of fluid flow according to the present invention.

Turning now to the drawings in which like reference numerals designate identical or corresponding parts throughout the several views, FIG. 1 is a schematic illustration of a cooled ESRF processing system that utilizes vaporized coolant as a replacement for baths of liquid coolants. According to the illustrated embodiment, an ESRF plasma source 100 is cooled by a source cooling chamber 105 using a vapor to remove heat from heated surfaces. A coolant is pumped from a fluid mass storage chamber 110 by a high pressure pump 115 through a length of tubing 117 and subsequently through a valve 120a. The pressure of the coolant is measured by a high pressure manometer 125a. The coolant then passes through a remotely controllable valve 130, through which the coolant mass flow rate is controlled. Upon exiting the mass flow controller 130, the coolant enters a manifold 305 (atop the shield 300; see FIG. 2) that distributes coolant to the ribs 303 of the shield. As described, the coolant enters the ribs at a pressure (1) greater than the pressure maintained within the source cooling chamber 105 and (2) less than the coolant vapor pressure. The pressure difference between the coolant entering the ribs of the shield and the vapor environment of the source cooling chamber 105 is such that, as the coolant emerges from an expansion orifice, it expands, hence, reducing the pressure to below its vapor pressure. At this point the coolant changes phase from a liquid to a gas. As the gas continues to expand to the ambient pressure within the source cooling chamber 105, it cools further (converting thermal energy to kinetic energy). Therefore, heat is transported away from the process tube by two mechanisms, namely: (1) conductive-convective heat transfer between the coolant (liquid state) and the process tube, and (ii) conductive-convective heat transfer between the process tube and the cool vapor impinging upon its surface. The shield ribs are, in turn, cooled by the first two mechanisms. Heat is transported to the coolant (in liquid state) as it flows through the manifold and ribs of the shield prior to passage through the expansion orifices 135. The heat transfer rate is proportional to (1) the surface area of the coolant conduits (within the distribution manifold and the shield ribs), (2) the temperature difference between the process tube (that is loosely thermally coupled to the ribs) and the shield ribs, and (3) the heat transfer coefficient.

Moreover, the heat transfer coefficient is primarily dependent upon the coolant flow rate and the coolant thermal properties (i.e., thermal conductivity, viscosity, specific heat at constant pressure, density, etc.). Secondly, heat is expelled from the shield ribs as the latent heat for vaporization of the coolant (necessary for the coolant to change phase from a liquid state to a gas state) is provided by both the hot shield ribs and contact of the coolant with the process tube. For an evaporating liquid, the heat transfer rate is proportional to the latent heat of vaporization and the coolant mass flow rate.

Lastly, the third mechanism represents direct heat transfer between the process tube and the cool vapor as it impinges upon the process tube surface. Similarly, the heat transfer rate is proportional to the process tube surface area, the temperature difference between the process tube and the impinging gas, and the heat transfer coefficient. For an array of impinging jets, the heat transfer coefficient is dependent upon the total area of expansion orifices, the distance between the orifice and the process tube, the gas velocity, and several gas properties (including the thermal conductivity, viscosity, specific heat at constant pressure, density, etc.).

The previously cooled gas absorbs heat in the source cooling chamber 105 and is eventually pumped through another length of pipe and a valve 120b before entering a condenser 140. In the condenser, the vapor goes through a reverse phase change, being converted back to a liquid.

During the conversion, heat is removed from the vapor as it becomes a liquid. The liquid then is pumped again by the high pressure pump 115. However, since the process of pressurizing the liquid in pump 115 typically adds thermal energy to the liquid, the liquid is first passed through a heat exchanger 145 in which heat can be given off before returning the liquid to the fluid mass storage chamber 110 for another cycle.

In order to control the cooling cycle, the high pressure manometer 125a and a second manometer 125b measure pressures at two locations in the cooling cycle—one before expansion and one after expansion. From the two pressures, a flowrate of the liquid and vapor can be determined. Using the flowrate, the cooling cycle can be controlled by controlling the flow control valve 130 to maintain a flow rate which provides a sufficient amount of vaporized coolant without creating a pool of coolant within the source cooling chamber 105.

The system also includes a vacuum pump 160 connected on the vapor side of the expansion orifice 135. This pump is used to evacuate the system of air before operation begins. The amount of vacuum created by the vacuum pump 160 is (1) controlled by valves 120c and 120d and (2) measured by the vacuum pressure manometer 155. The vacuum pump 160 can likewise be controlled to pump more or less based on the reading of the manometer 155. After evacuating the system, the system is checked for leaks and then back-filled with a predetermined charge of coolant.

In addition to having an inlet and outlet used during normal fluid flow, the fluid mass storage chamber 110 also includes a residual contaminant relief valve. This valve can be used to bleed off gaseous contaminants that rise to the top of the fluid mass storage chamber. The relief valve is either pressure activated or manually controlled.

Figure 2:
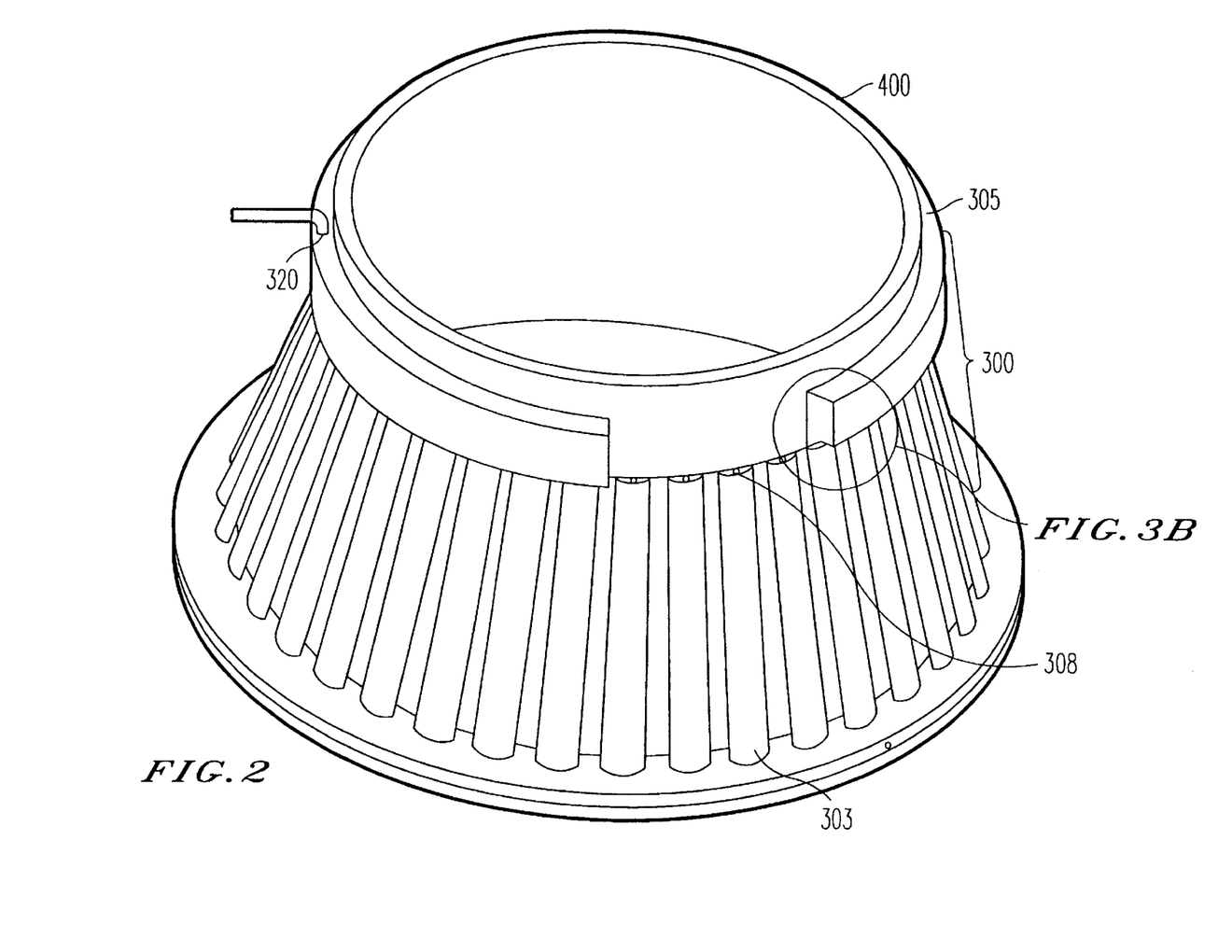
FIG. 2 is an illustration of a multiple spray nozzle cooling shield.
Figure 3B:
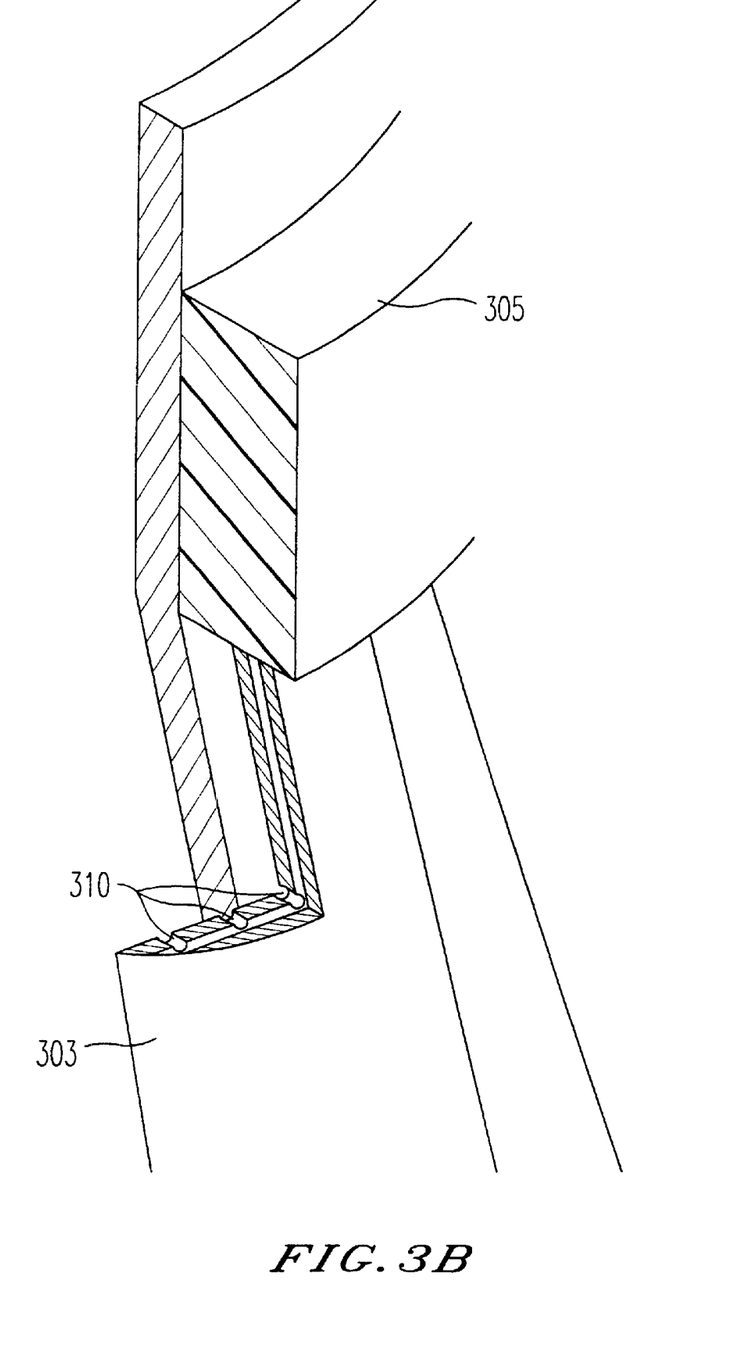
FIG. 3B is an expanded view of openings (either orifices or gas holes) in the multiple spray nozzle cooling shield shown in FIG. 2.
Figure 4:
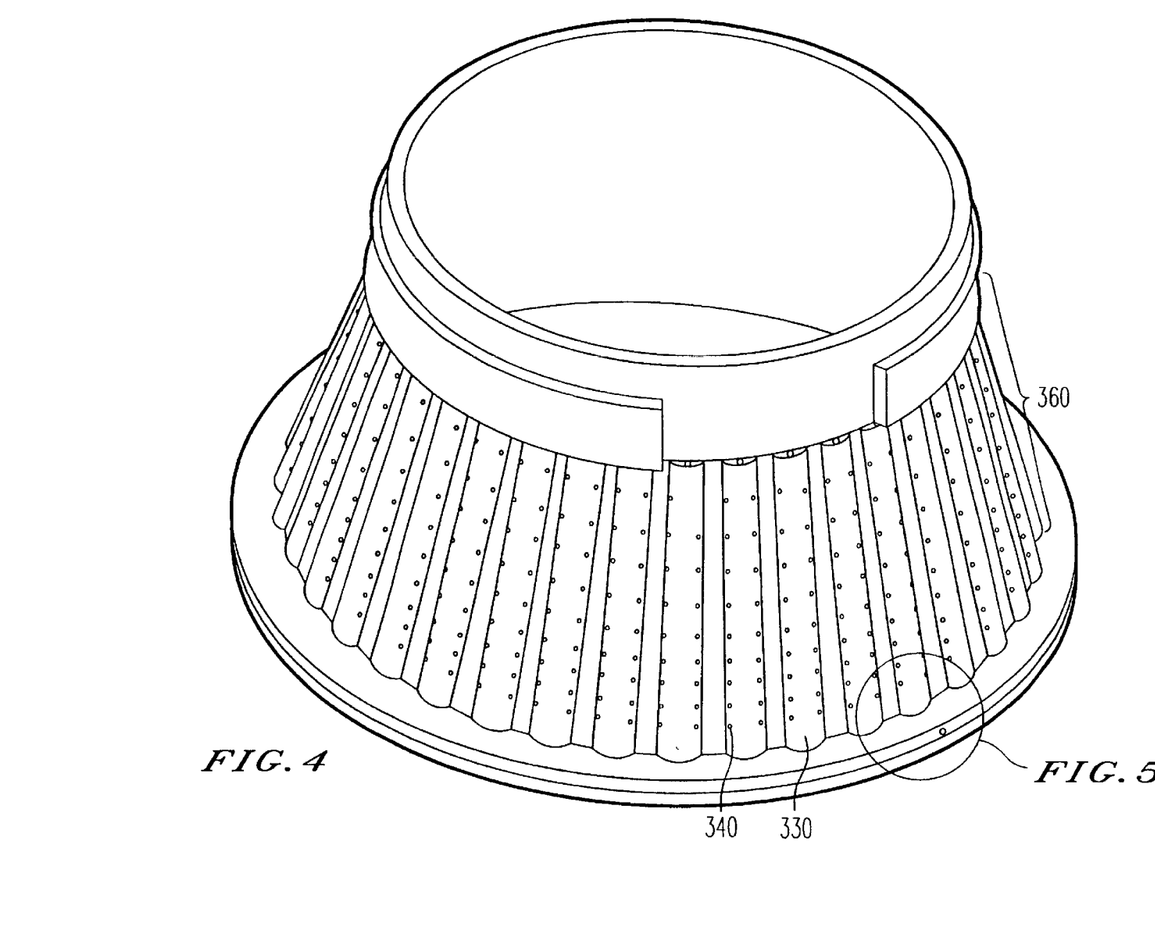
FIG. 4 is an illustration of a multiple orifice cooling rib shield.

The above method is preferably used in conjunction with either the multiple spray nozzle cooling shield 300 shown in FIG. 2 (see close-up in FIG. 3B) or with the multiple orifice cooling rib shield 360 shown in FIG. 4. Both of these shields are advantageous since they provide fluid to be vaporized in sufficient quantities to remove the local heat load but without generating micro-bubbles on the surface of the coils. In an alternate embodiment of the shields 300 and 360, the shields are electrostatic shields rather than just cooling shields. The rate at which the vapor is pumped out of the chamber must be higher than that for a liquid coolant since the vaporized coolant displaces a larger volume than the corresponding liquid before the phase change. (However, the flow rate of the present invention is less than the flow rate of conventional systems. Whereas 7.6 joules per gram of flow allows a 10 degree C fluid temperature change in known liquid coolant systems, the present invention allows a 100 joule pickup for an equivalent flow.) In general, however, the system controls flow of the liquid coolant to ensure that the liquid coolant is substantially completely vaporized prior to being applied to the process to be (or the bias shield as described in further detail below). Although it is not possible to ensure complete vaporization, substantially complete vaporization allows the vapor to be applied without causing arcing in liquid coolant.

Figure 3A:
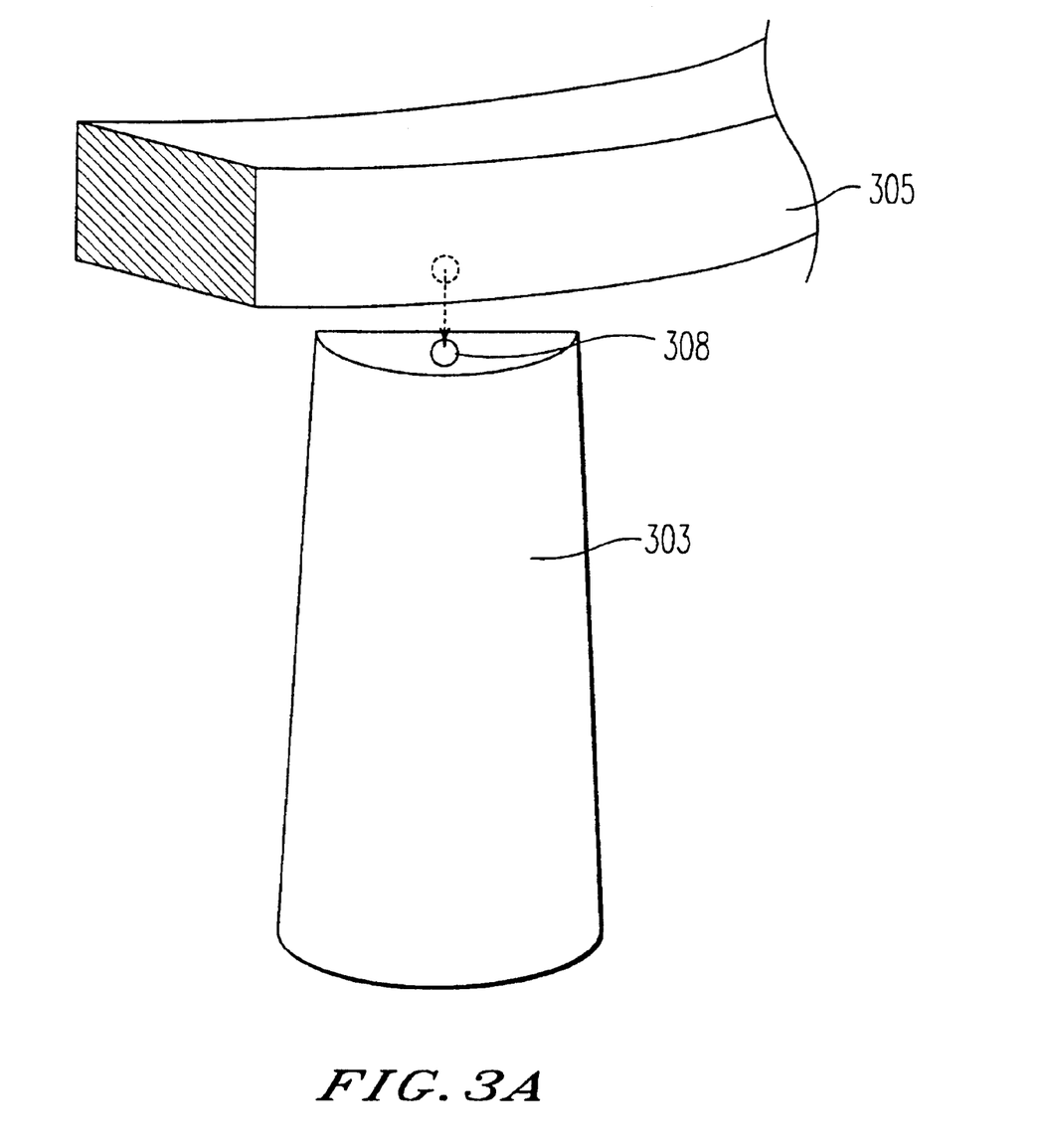
FIG. 3A is an expanded view of the interface between the manifold and a rib of the shield of FIG. 2.

As shown in FIG. 2, multiple ribs 303 of the shield 300 are arranged to provide uniform cooling of the outside of a process tube 400 that is housed a short distance (0.1250–0.375 inch) inside of the shield 300. As shown in FIG. 3A, coolant is pumped into the shield 300 through the manifold 305 (via coolant entry hole 320 shown in FIG. 2) and forced through drill holes 308 (located at the bottom of the manifold 305 and at the top of rib 303). As shown in FIG. 3B, once the coolant passes through the bottom of the manifold 305 into the rib 303, the coolant is then expelled through the openings 310. In a first embodiment of the shield 300, the openings 310 act as expansion orifices 135 and direct coolant towards an interior of the shield, i.e., towards an outer shell of the process tube 400. In an alternate embodiment of the shield 300, the drill hole 308 acts as the expansion orifice 135 for the corresponding rib 303. In that embodiment, the openings 310 are simply holes large enough to allow the vaporized coolant to pass there through in a quantity sufficient to cool the process tube 400. In yet another alternate embodiment, the coolant entry hole 320 (shown in FIG. 2) acts as a single orifice for the entire cooling system. Accordingly, the manifold 305 is filled with vaporized coolant. To accommodate the flow of vaporized coolant, the drill holes 308 and the openings 310 are enlarged as compared to when they carried liquid and/or acted as orifices 135.

Figure 5:
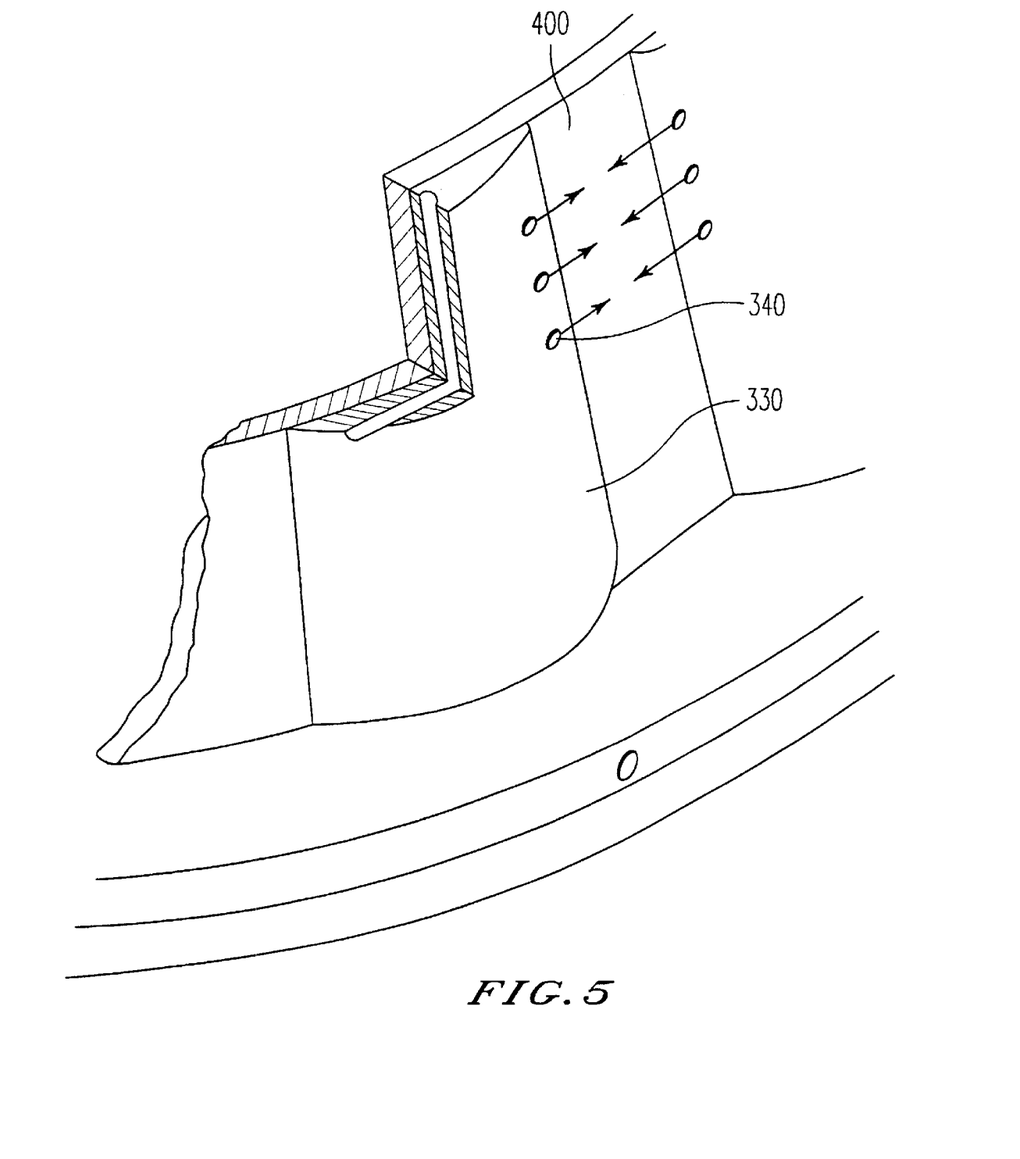
FIG. 5 is an expanded view of orifices in the multiple orifice cooling rib shield shown in FIG. 4.

As shown in FIG. 4, a multiple orifice cooling rib shield 360 contains multiple individual ribs 330, each with multiple orifices 340. Each orifice 340 is designed to cool a single rib 330 and a corresponding portion of the shield 360 adjacent to the rib. (As discussed above, the shield 360 may either be a simple cooling shield or an electrostatic shield.) The embodiment provides an additional heat transport mechanism compared to the first embodiment—i.e., conduction heat transfer between the process tube and the shield ribs as the shield ribs are cooled by the coolant latent heat of vaporization. The density of the orifices 340 increases as the area at the bottom of the conical shield 360 increases. This arrangement matches the need for more heat removal at the bottom of the shield 360. An enlarged section of a rib 330 is shown in FIG. 5 with three orifices 340. In one embodiment of the present invention, the orifices are shaped and positioned so as to impinge streams of gas semi-perpendicular to the ribs such that the streams collide and disperse toward the wall of the process tube 400. In a second embodiment, the orifices are shaped and positioned so as to impinge streams of vapor directly onto the wall of the process tube 400. In the second embodiment, the streams are directed so as to cool their corresponding half of the portion of the process tube between adjacent ribs. As further described above, the orifices 340 can be replaced by larger openings when the coolant has already been vaporized prior to or upon entering the rib 330 through the drill holes 308.

In addition, the shield 360 is made of a thermally very conductive material in order to remove heat more evenly. In the embodiment in which the shield 360 is an electrostatic shield, the ribs 330 are further designed to have narrow cross sections opposing each other to minimize the capacitive coupling between adjacent ribs. Capacitive coupling across the gap in an electrostatic shield increases insertion loss of the electrostatic shield.

Figure 6:
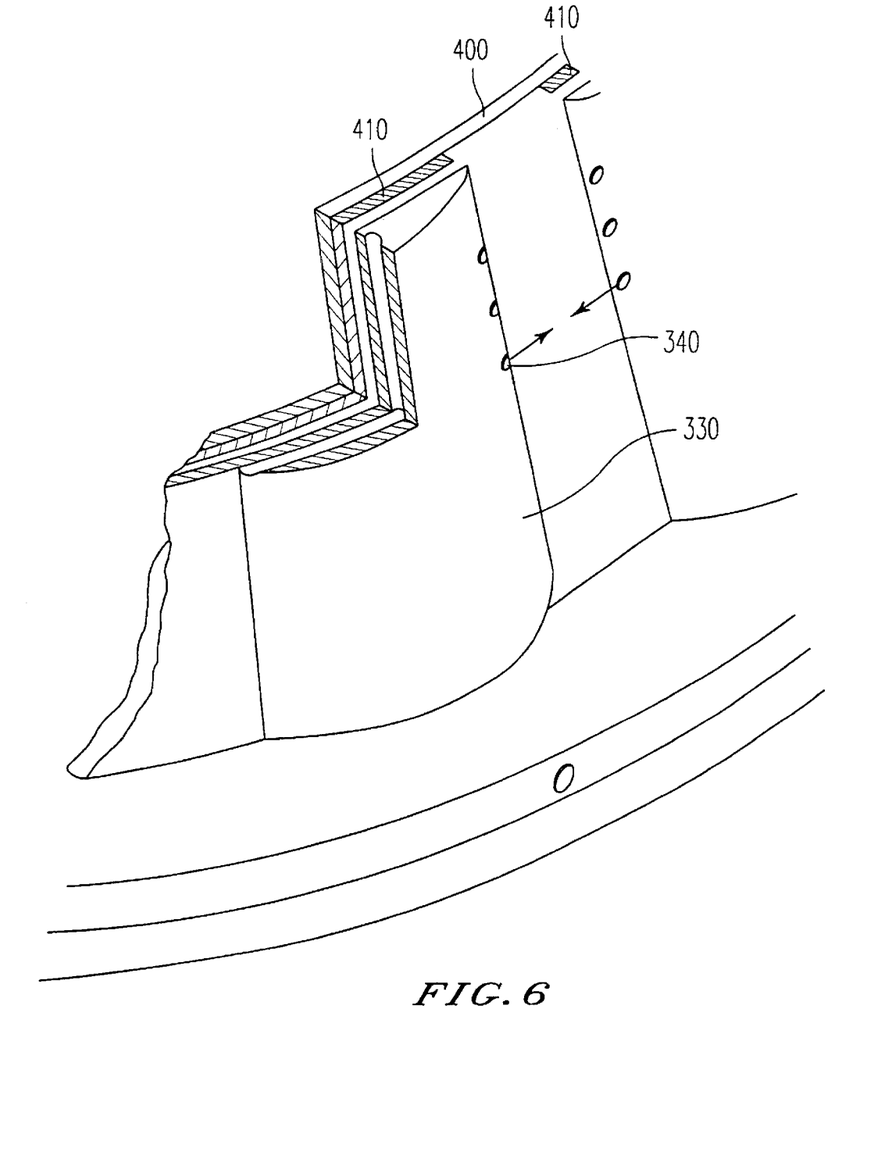
FIG. 6 is an expanded view of orifices in the multiple orifice cooling rib shield shown in FIG. 4 which apply the cooled vapor to a bias shield.

Similar to the embodiment shown in FIG. 5, FIG. 6 shows another embodiment in which a slotted bias shield 410 is interposed between the process tube 400 and an electrostatic shield 360. In this embodiment, the bias shield 410 receives heat from the process tube 400 and is cooled by the vapor rather than cooling the process tube directly. In order to prevent direct electrical contact between the bias shield 410 and the electrostatic shield 330, an electrical insulator is placed there between. Although the insulator depicted in FIG. 6 is simply an air gap, other electrical insulators are possible.

Figure 7A:
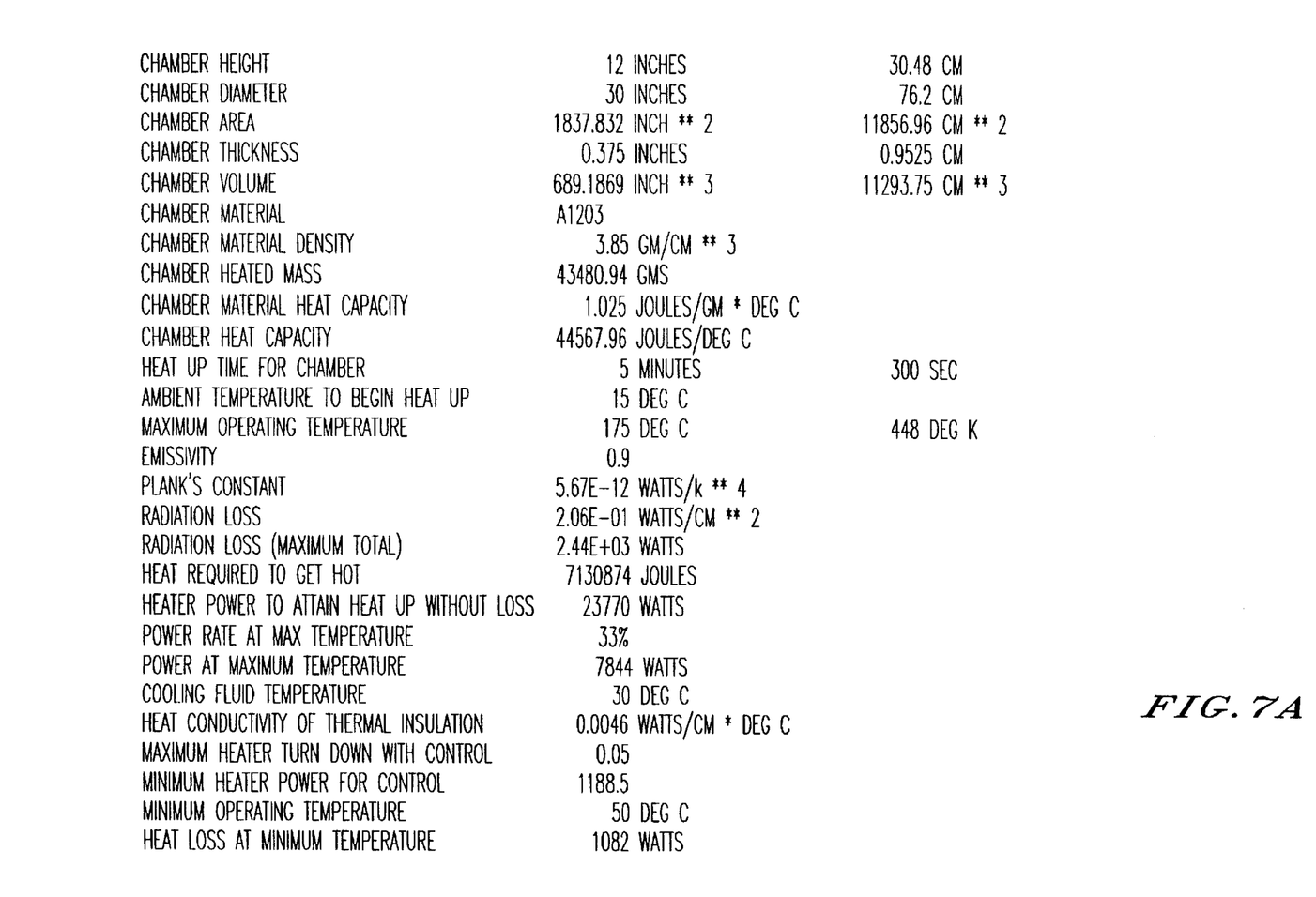
FIGS. 7A and 7B are a chart showing the cooling characteristics of various commercially available coolants.
Figure 7B:
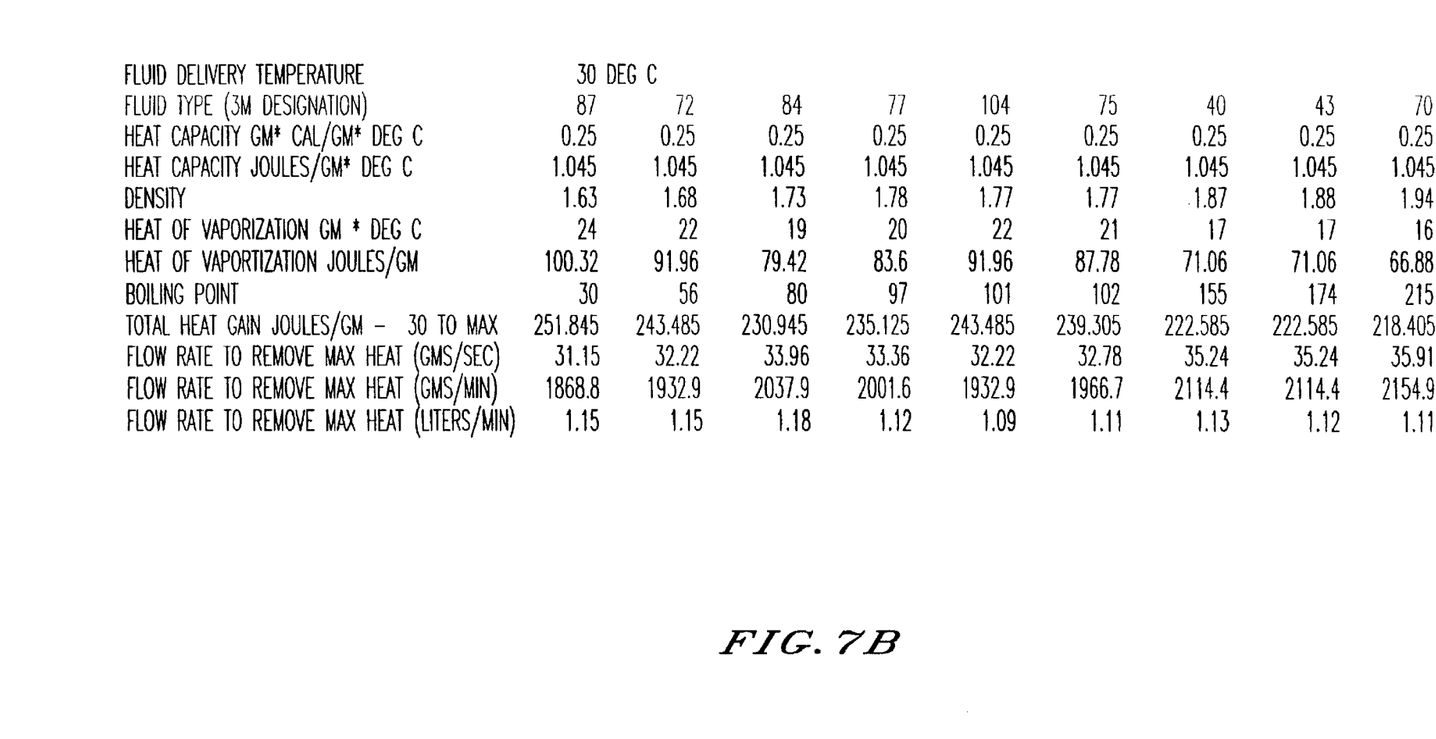

As shown in FIGS. 7A and 7B, nine different coolants were tested to determine how changes in boiling point and other characteristics affect heat removal through vaporization. Although the boiling points ranged from 30 degrees Celsius to 215 degrees Celsius, the flow rate necessary to remove the maximum heat varied only from 1.15 liters/min to 1.11 liters/min. Accordingly, a wide range of coolants can be used in the present invention to remove heat through vaporization of coolants.

Obviously, numerous modifications and variations of the present invention are possible in light of the above teachings. It is therefore to be understood that, within the scope of the appended claims, the invention may be practiced otherwise than as specifically described above.

What is claimed is:

1. A system for cooling a plasma processing system comprising:
   a process tube;
   a shield surrounding the process tube for cooling the process tube using vaporized coolant; and
   a flow rate control device for controlling a flow rate of liquid coolant within the system to ensure that the liquid coolant is substantially completely vaporized,
   wherein the shield comprises plural ribs with plural spray nozzles for vaporizing the liquid coolant and applying the vaporized coolant to an exterior of the process tube adjacent to the plural ribs.

2. A system for cooling a plasma processing system comprising:
   a process tube;
   a shield surrounding the process tube for cooling the process tube using vaporized coolant; and
   a flow rate control device for controlling a flow rate of liquid coolant within the system to ensure that the liquid coolant is substantially completely vaporized,
   wherein the shield comprises plural ribs with plural orifices for cooling the process tube by applying the vaporized coolant to an exterior of the process tube adjacent to the plural ribs.

3. The system as claimed in claim 1, further comprising a heat exchanger for converting the vapor into cooled coolant for re-application to the system.

4. The system as claimed in claim 1, further comprising a reservoir for holding liquid coolant prior to vaporizing the liquid coolant.

5. The system as claimed in claim 1, wherein the shield is an electrostatic shield.

6. The system as claimed in claim 2, wherein the shield is an electrostatic shield.

7. A method for cooling a plasma processing system comprising the steps of:
   surrounding a process tube with a shield having plural ribs;
   cooling the process tube using vaporized coolant;
   controlling a flow rate of liquid coolant within the system to ensure that the liquid coolant is substantially completely vaporized; and
   further comprising the steps of vaporizing the liquid coolant and applying the vaporized coolant to an exterior of the process tube underneath the plural ribs.

8. A method for cooling a plasma processing system comprising the steps of:
   surrounding a process tube with a shield having plural ribs;
   cooling the process tube using vaporized coolant; and
   controlling a flow rate of liquid coolant within the system to ensure that the liquid coolant is substantially completely vaporized,
   wherein the step of cooling comprises the step of vaporizing the liquid coolant and applying the vaporized coolant to an exterior of the shield adjacent the plural ribs.

9. The method as claimed in claim 7, further comprising the step of recooling the vaporized coolant in a heat exchanger.

10. The method as claimed in claim 7, further comprising the step of evacuating and purging a chamber of the process tube to identify leaks.

11. The method as claimed in claim 7, wherein the shield is an electrostatic shield.

12. The method as claimed in claim 8, wherein the shield is an electrostatic shield.

13. A method for cooling a plasma processing system comprising the steps of:
    surrounding a process tube with a shield having plural ribs;
    cooling the process tube using vaporized coolant;
    controlling a flow rate of liquid coolant within the system to ensure that the liquid coolant is substantially completely vaporized; and
    vaporizing the liquid coolant at plural orifices in each of the plural ribs that are opposite the process tube.

14. A method for cooling a plasma processing system comprising the steps of:
    surrounding a process tube with a shield having plural ribs;
    cooling the process tube using vaporized coolant;
    controlling a flow rate of liquid coolant within the system to ensure that the liquid coolant is substantially completely vaporized; and
    vaporizing the liquid coolant at an orifice at an intersection of a manifold of the shield and each of the plural ribs.

15. A method for cooling a plasma processing system comprising the steps of:
    surrounding a process tube with a shield having plural ribs;
    cooling the process tube using vaporized coolant;
    controlling a flow rate of liquid coolant within the system to ensure that the liquid coolant is substantially completely vaporized; and
    vaporizing the liquid coolant at an orifice forming a coolant entry hole in a manifold of the shield.

16. The system as claimed in claim 2, further comprising a heat exchanger for converting the vapor into cooled coolant for re-application to the system.

17. The system as claimed in claim 2, further comprising a reservoir for holding liquid coolant prior to vaporizing the liquid coolant.

18. The method as claimed in claim 8, further comprising the step of recooling the vaporized coolant in a heat exchanger.

19. The method as claimed in claim 8, further comprising the step of evacuating and purging a chamber of the process tube to identify leaks.

* * * * *